(12) United States Patent
Gattere et al.

(10) Patent No.: US 12,117,464 B2
(45) Date of Patent: *Oct. 15, 2024

(54) MEMS INERTIAL SENSOR WITH HIGH RESISTANCE TO STICTION

(71) Applicant: STMicroelectronics S.r.l., Agrate Brianza (IT)

(72) Inventors: Gabriele Gattere, Castronno (IT); Francesco Rizzini, Passirano (IT); Alessandro Tocchio, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 18/147,629

(22) Filed: Dec. 28, 2022

(65) Prior Publication Data

US 2023/0184806 A1 Jun. 15, 2023

Related U.S. Application Data

(63) Continuation of application No. 16/898,350, filed on Jun. 10, 2020, now Pat. No. 11,543,428.

(30) Foreign Application Priority Data

Jun. 20, 2019 (IT) .......................... 102019000009651

(51) Int. Cl.
*G01P 15/125* (2006.01)
*B81C 1/00* (2006.01)
*G01P 15/08* (2006.01)

(52) U.S. Cl.
CPC ........ *G01P 15/125* (2013.01); *B81C 1/00968* (2013.01); *G01P 2015/0874* (2013.01)

(58) Field of Classification Search
CPC ........ G01P 15/125; G01P 15/08; G01P 15/18; G01P 15/097; G01P 15/0802; G01P 2015/0874; B81C 1/00968
See application file for complete search history.

(56) References Cited

U.S. PATENT DOCUMENTS 6,029,517 A 2/2000 Brun et al.
8,596,123 B2 12/2013 Schultz
(Continued)

FOREIGN PATENT DOCUMENTS

CN 1847857 A 10/2006
CN 101000360 A 7/2007
(Continued)

OTHER PUBLICATIONS

Translation of CN109154627.*

*Primary Examiner* — Helen C Kwok
(74) *Attorney, Agent, or Firm* — Seed IP Law Group LLP

(57) ABSTRACT

An inertial structure is elastically coupled through a first elastic structure to a supporting structure so as to move along a sensing axis as a function of a quantity to be detected. The inertial structure includes first and second inertial masses which are elastically coupled together by a second elastic structure to enable movement of the second inertial mass along the sensing axis. The first elastic structure has a lower elastic constant than the second elastic structure so that, in presence of the quantity to be detected, the inertial structure moves in a sensing direction until the first inertial mass stops against a stop structure and the second elastic mass can move further in the sensing direction. Once the quantity to be detected ends, the second inertial mass moves in a direction opposite to the sensing direction and detaches the first inertial mass from the stop structure.

17 Claims, 6 Drawing Sheets

(56) References Cited

U.S. PATENT DOCUMENTS

| | | | |
|---|---|---|---|
| 9,377,482 B2 | 6/2016 | Comi et al. | |
| 11,543,428 B2* | 1/2023 | Gattere | B81C 1/00968 |
| 2002/0112538 A1 | 8/2002 | Pinter et al. | |
| 2004/0079154 A1* | 4/2004 | Yoshikawa | G01P 15/125 |
| | | | 73/514.32 |
| 2010/0107763 A1* | 5/2010 | Lin | G01P 15/18 |
| | | | 73/514.32 |
| 2010/0122579 A1* | 5/2010 | Hsu | G01P 15/18 |
| | | | 73/514.32 |
| 2010/0263445 A1 | 10/2010 | Hayner et al. | |
| 2011/0048131 A1 | 3/2011 | Reinmuth | |
| 2012/0125104 A1 | 5/2012 | Qiu et al. | |
| 2012/0216616 A1 | 8/2012 | Schultz | |
| 2012/0291546 A1 | 11/2012 | Jeong et al. | |
| 2014/0260613 A1 | 9/2014 | Qiu et al. | |
| 2016/0084872 A1 | 3/2016 | Naumann | |
| 2017/0082519 A1* | 3/2017 | Blomqvist | B81B 3/001 |
| 2018/0045515 A1 | 2/2018 | Simoni et al. | |
| 2019/0187170 A1 | 6/2019 | Painter et al. | |
| 2021/0188619 A1 | 6/2021 | Flader | |

FOREIGN PATENT DOCUMENTS

| | | | | |
|---|---|---|---|---|
| CN | 104684841 A | | 6/2015 | |
| CN | 109154627 | * | 1/2019 | G01P 15/0802 |
| WO | WO 2015014179 A1 | | 2/2015 | |

* cited by examiner

MEMS INERTIAL SENSOR WITH HIGH RESISTANCE TO STICTION

BACKGROUND

Technical Field

The present disclosure relates to a MEMS (MicroElectroMechanical System) inertial sensor with high resistance to stiction. In particular, hereinafter reference is made to a MEMS accelerometer of a capacitive type.

Description of the Related Art

As is known, MEMS accelerometers comprise a suspended inertial mass having a main extension plane. Generally, the inertial mass is carried to be mobile in a direction (sensing axis) lying in or parallel to the main extension plane, as a result of external accelerations.

For instance, FIGS. 1A and 1B show a known MEMS accelerometer 1 of a capacitive type in two different operating positions. In particular, the MEMS accelerometer 1 extends in a first plane XY of a Cartesian reference system XYZ and has a sensing axis S extending in the same first plane XY, in particular parallel to a first Cartesian axis Y of the Cartesian reference system XYZ. In detail, FIG. 1A shows the MEMS accelerometer 1 in a rest condition. In this condition, the centroid O of the MEMS accelerometer 1 is set in a point do along the first Cartesian axis Y.

The MEMS accelerometer 1 comprises an inertial mass 3, of semiconductor material (for example, silicon), having a mass m and extending on a substrate which is not visible in FIGS. 1A and 1B. Here, the inertial mass 3 has the shape, in top view, of a quadrangular (for example, rectangular) frame and has an opening 9.

A first and a second electrode 13, 15, of conductive material (for example, silicon), extend in the opening 9 and are anchored to the substrate (not visible) by respective anchoring portions 13A, 15A. In particular, the electrodes 13, 15 have, in top view, an elongated quadrangular shape (for example, rectangular) with main extension along a second Cartesian axis X of the Cartesian reference system XYZ.

The inertial mass 3 has a first and a second inner surface 3A, 3B, facing the opening 9 and the electrodes 13, 15 and extending perpendicular to the sensing axis S, here parallel to a second plane XZ of the Cartesian reference system XYZ.

In greater detail, in the rest condition of the MEMS accelerometer 1, the first and second inner surfaces 3A, 3B are arranged at a first and a second distance $d_1$, $d_2$ from the first and, respectively, the second electrode 13, 15. The first and second surfaces 3A, 3B and the respective first and second electrodes 13, 15 are capacitively coupled to each other and form the plates of corresponding capacitors, having capacitances $C_1$, $C_2$ in the rest condition of the MEMS accelerometer 1.

The inertial mass 3 is here passed throughout its entire thickness (in a direction parallel to a third Cartesian axis Z) by a plurality of holes 17 that allow, during the manufacturing process, the release of the inertial mass 3.

The inertial mass 3 is coupled to a constraint element 5, fixed to and rigid with the substrate (not illustrated), by a spring element 7 configured to allow a displacement, here a translation, of the inertial mass 3 along the sensing axis S in response to an external acceleration $a_{ext}$ having a component directed parallel to the first Cartesian axis Y. In the illustrated embodiment, the constraint element 5 is arranged on the outside of the inertial mass 3 and coupled to a first outer wall 3C of the frame shape of the latter.

The MEMS accelerometer 1 further comprises a stop element 19, for example formed by a fixed region extending from the substrate (not shown) at a distance from the inertial mass 3. In particular, in the illustrated embodiment, the stop element 19 is arranged on the outside of the inertial mass 3, on a second outer wall 3D of the latter, opposite to the first outer wall 3C. In the rest condition of the MEMS accelerometer 1, illustrated in FIG. 1A, the stop element 19 is arranged at a stop distance $d_s$ from the second outer wall 3D of the inertial mass 3.

In use, the inertial mass 3 and the electrodes 13, 15 are biased at respective biasing voltages, which result, for example, in an effective voltage of approximately 1 V between the inertial mass 3 and the electrodes 13, 15.

As a result of the biasing, the inertial mass 3 is subjected to a total electrostatic force $F_{el}$, given by the sum of a first and a second electrostatic force $F_{el1}$, $F_{el2}$. In detail, the first electrostatic force $F_{el1}$ acts between the first electrode 13 and the first inner surface 3A, and the second electrostatic force $F_{el2}$ acts between the second electrode 15 and the second inner surface 3B.

The MEMS accelerometer 1 is designed so that, in the rest condition (FIG. 1A), the first and second distances $d_1$, $d_2$ between the inertial mass 3 and the electrodes 13, 15 are equal to each other, as are the first and second capacitances $C_1$, $C_2$; therefore, the first and second electrostatic forces $F_{el1}$, $F_{el2}$ are equal to each other and the total electrostatic force $F_{el}$ is zero.

Consequently, in rest condition, the spring element 7 is undeformed.

In use, an external acceleration $a_{ext}$, acting on the fixed structure of the MEMS accelerometer 1 and directed along the sensing axis S (for example, downwards in the drawing plane), causes a translation of the inertial mass 3 along the sensing axis S in an opposite direction to the external acceleration $a_{ext}$, as shown in FIG. 1B.

Consequently, the distances $d_1$, $d_2$ (and therefore the capacitances $C_1$, $C_2$) vary. In particular, with the illustrated external acceleration $a_{ext}$, the first distance $d_1$ decreases and the second distance $d_2$ increases; moreover, since it is known that the capacitances $C_1$, $C_2$ are inversely proportional to the respective distances $d_1$, $d_2$, the first capacitance $C_1$ increases and the second capacitance $C_2$ decreases.

The translation of the inertial mass 3 is interrupted when it abuts against the stop element 19, having covered a distance equal to the stop distance $d_s$ (FIG. 1B). In this situation, the centroid O of the inertial mass 3 is in a translated position $d_T = d_0 + d_s$ along the first Cartesian axis Y. Moreover, the distance between the first electrode 13 and the first inner surface 3A decreases and becomes equal to $d_1 - d_s$ and the distance between the second electrode 15 and the second inner surface 3B increases and becomes equal to $d_2 + d_s$. Consequently, the first and second capacitances $C_1$, $C_2$, as well as the respective first and second electrostatic forces $F_{el1}$, $F_{el2}$, are no longer equal.

In particular, when in abutment, the inertial mass 3 is subject to a total electrostatic force $F_{el}$, given by Eq. 1:

$$F_{el} = F_{el1} + F_{el2} = \frac{1}{2}\frac{\varepsilon A_{el}}{(d_1 - d_s)^2}\Delta V^2 + \frac{1}{2}\frac{\varepsilon A_{el}}{(d_2 + d_s)^2}\Delta V^2 \quad (1)$$

where ε is the dielectric constant, $A_{el}$ is the area of the electrodes 13, 15 (and therefore of the portion of the surfaces 3A, 3B of the inertial mass 3 facing them), and ΔV is the voltage between the plates of the capacitors $C_1$, $C_2$.

Moreover, when the inertial mass 3 abuts against the stop element 19 (FIG. 1B), a stiction force $F_a$ acts thereon and tends to keep it into abutment, because the inertial mass 3 and the stop element 19 are of the same material (for example, silicon).

As soon as the external acceleration $a_{ext}$ terminates (i.e., $a_{ext}=0$), an elastic return force $F_m$ exerted by the spring element 7 brings the inertial mass 3 back into the rest position illustrated in FIG. 1A. In particular, the elastic return force $F_m$ acts along the sensing axis S, opposite to the displacement direction of the inertial mass 3.

The elastic return force $F_m$ is given in a known way by the following equation:

$$F_m = -k \cdot d_s \qquad (2)$$

To overcome the stiction force $F_a$ and bring the inertial mass 3 back into the rest position (FIG. 1A), so that it can detect further accelerations acting from the outside, the spring element 7 is designed so that the elastic return force $F_m$ compensate both the stiction force $F_a$ and the total electrostatic force $F_{el}$ set up in the step of FIG. 1B. In other words, it is desired that:

$$F_m > \alpha(F_{el} + F_{a(t=0)}) \qquad (3)$$

where $F_{a(t=0)}$ is the native stiction force (i.e., the stiction force estimated prior to first use of the MEMS accelerometer 1) and α is a safety coefficient.

However, estimation and compensation of the stiction force $F_a$ are complex.

In fact, the stiction force $F_a$ depends upon a large number of tribological aspects linked to the geometry, materials, manufacturing processes, and operating conditions and is moreover variable in time.

In addition, the safety coefficient α in Eq. 3 cannot be freely set and derives from trade-off considerations between the desired performance and the manufacturing costs. In fact, it depends upon constructional and electromechanical parameters of the MEMS accelerometer 1 (e.g., the constant k of the spring element 7, the stop distance $d_s$ between the second outer wall 3D of the inertial mass 3 and the stop element 19 and the area Ai of the electrodes 13, 15). However, current constructional requirements (such as bandwidth, packaging, noise and full scale) do not allow the aforesaid constructional parameters to be freely choosen, and thus it is not always possible to maximize the safety coefficient α.

BRIEF SUMMARY

One of more embodiments of the present disclosure provide a MEMS inertial sensor that overcomes one or more of the drawbacks of the prior art.

According to the present disclosure a MEMS inertial sensor is provided.

BRIEF DESCRIPTION OF THE SEVERAL
VIEWS OF THE DRAWINGS

For a better understanding of the present disclosure, embodiments thereof are now described, purely by way of non-limiting example, with reference to the attached drawings, wherein:

FIGS. 1A and 1B schematically show a known MEMS inertial sensor in top view respectively in a rest position and in presence of an external acceleration;

FIG. 2 schematically show the present inertial MEMS sensor in top view and in a rest position;

FIGS. 3-5 schematically show the present MEMS inertial sensor according to an embodiment in successive positions, when subject to an external acceleration;

DETAILED DESCRIPTION

Figure 2:
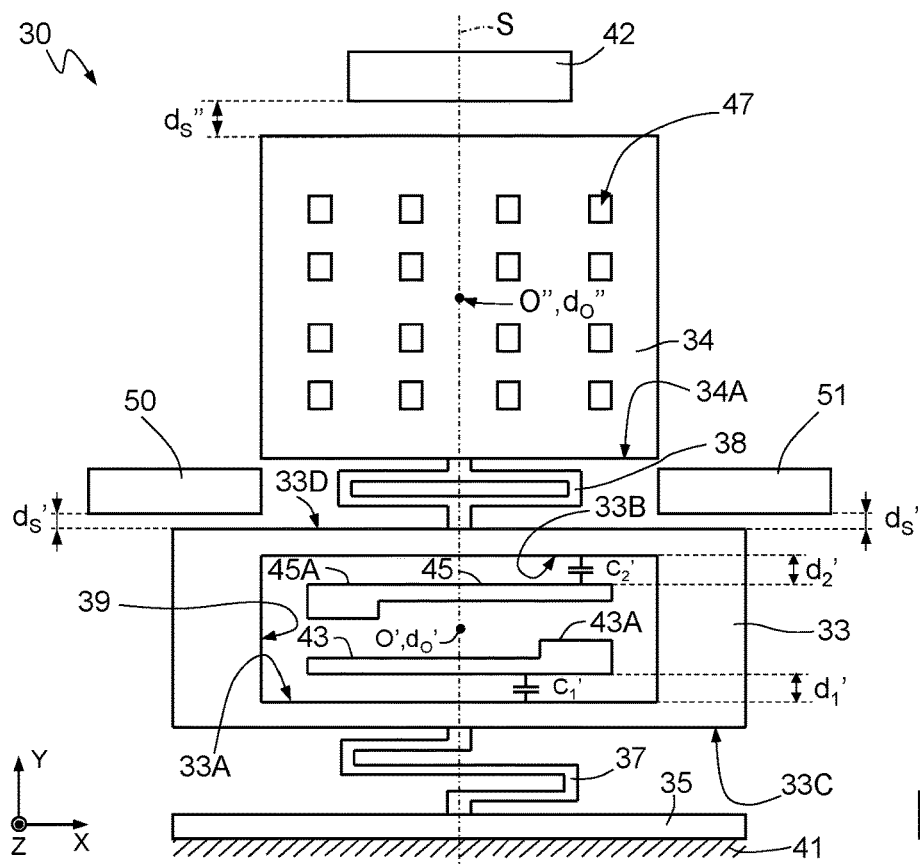

FIG. 2 shows a MEMS inertial sensor, in particular a MEMS accelerometer 30 of a capacitive type configured to detect external accelerations directed along a sensing axis S, extending in a first plane XY of a Cartesian reference system XYZ, in particular parallel to a first Cartesian axis Y of the Cartesian reference system XYZ. In particular, FIG. 2 shows the MEMS accelerometer 30 in a rest condition.

Figure 1A:
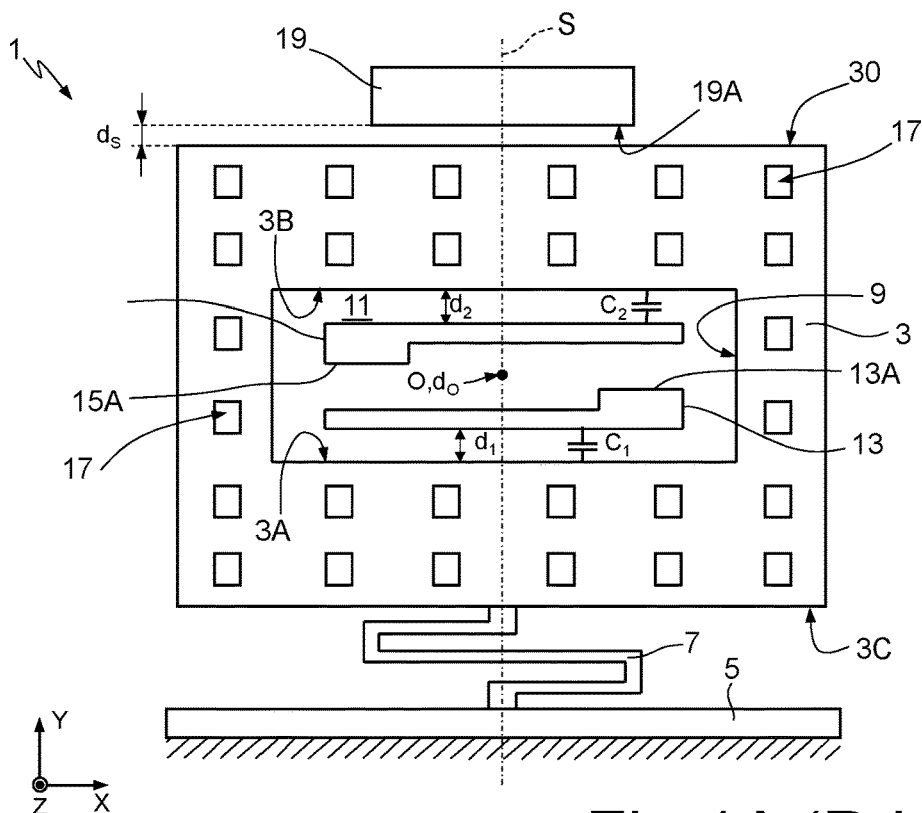

The MEMS accelerometer 30 comprises a first and a second inertial mass 33, 34, of semiconductor material (for example, silicon), having a first and, respectively, a second mass $m_1$, $m_2$. In general, for a same sensitivity and behavior of the MEMS accelerometer 30, as explained in detail hereinafter, the sum of the first and second masses $m_1$, $m_2$ is equal to the mass m of the MEMS accelerometer 1 of FIGS. 1A-1B, and the second mass $m_2$ is, for example, greater than the first mass $m_1$. For instance, the ratio between the first and second masses $m_1/m_2$ is advantageously 0.5.

The first and second inertial masses 33, 34 have a substantially planar structure with main dimensions along the first Cartesian axis Y and a second Cartesian axis X of the Cartesian reference system XYZ and a thickness (along a third Cartesian axis Z) negligible with respect to the first two dimensions. They therefore mainly extend in the first plane XY.

The first and second inertial masses 33, 34 have respective centroids O' and O" that, in the rest condition of FIG. 2, are arranged in a first and, respectively, a second rest position $d_0'$, $d_0''$ (it is noted that the notation $d_0'$, $d_0''$, etc., will be used hereinafter to indicate both the positions of the centroids O' and O" and their distances from the center of the Cartesian system XYZ along the first Cartesian axis Y).

The first and second masses 33, 34 extend above the substrate, not visible in FIG. 2 and part of a fixed structure 41 of semiconductor material (for example, silicon).

In the illustrated embodiment, the first inertial mass 33 has the shape, in top view, of a quadrangular (for example, rectangular) frame and has an opening 39. A first and a second electrode 43, 45, of conductive material (for example, doped silicon), extend within the opening 39 starting from the substrate (not illustrated) to which they are anchored by respective anchoring portions 43A, 45A.

In particular, the electrodes 43, 45 have, in top view, an elongated quadrangular shape (for example, rectangular) with main extension along the second Cartesian axis X.

The first inertial mass 33 has a first and a second inner surface 33A, 33B, facing the opening 39 and the electrodes 43, 45, respectively, and extending perpendicular to the sensing axis S, here parallel to a second plane XZ of the Cartesian reference system XYZ.

In the rest condition of the MEMS accelerometer 30 of FIG. 2, the first and second electrodes 43, 45 are arranged at a first and, respectively, a second distance $d_1'$, $d_2'$ from the respective first and second surface 33A, 33B. Moreover, the first and second surfaces 33A, 33B are capacitively coupled to the first and, respectively, to the second electrode 43, 45 and form the plates of corresponding capacitors having a first and, respectively, a second capacitance $C_1'$, $C_2'$.

The first inertial mass 33 is coupled to a fixed constraint element 35, fixed to and rigid with the substrate (not illustrated), through a first spring element 37 configured to allow a displacement, here a translation, of the first inertial mass 33 along the sensing axis S in response to an external acceleration $a_{ext}$ having a component parallel to the first Cartesian axis Y. In the illustrated embodiment, the constraint element 35 is arranged outside of the first inertial mass 33 and is coupled to a first outer wall 33C of the frame shape of the latter by the first spring element 37. Moreover, the first spring element 37 is, for example, of the folded type with a serpentine shape in top view and has a first elastic constant $k_1$ typically of the same value as the elastic constant k of the spring element 7 of the MEMS accelerometer 1 of FIGS. 1A-1B, so as not to modify the sensitivity of the accelerometer 30. For instance, the first elastic constant $k_1$ may be comprised between 1 and 50 N/m.

The second inertial mass 34 is coupled to the first inertial mass 33 by a second spring element 38, having, for example, a substantially annular shape in top view. In particular, the second spring element 38 has a second elastic constant $k_2$ much greater than the first elastic constant $k_1$; for example, the ratio is equal to 0.01. Consequently, the second spring element 38 is stiffer than the first spring element 37.

The second spring element 38 is configured to deform, in presence of an external acceleration $a_{ext}$ acting on the MEMS accelerometer 30 and directed along the sensing axis S, as described in detail hereinafter.

In FIG. 2, the second inertial mass 34 is further traversed, throughout its entire thickness, by a plurality of holes 47 that allow, during the manufacturing process, the release of the second inertial mass 34, in a per se known manner. Likewise, similar through holes can extend throughout the first inertial mass 33.

The MEMS accelerometer 30 further comprises a stop structure, here formed by a first and a second stop element 50, 51, for example of semiconductor material such as silicon, and formed by fixed regions, rigid with the fixed structure 41 and, for example, extending from the substrate (not shown) at a distance from the first inertial mass 33. In particular, in the illustrated embodiment, the stop elements 50, 51 are arranged between the first and second inertial masses 33, 34, facing a second outer wall 33D thereof, arranged on a side of the first inertial mass 33 opposite to the side of the first outer wall 33C. Moreover, in the embodiment illustrated in FIG. 2, the first and second stop elements 50, 51 face respective peripheral portions of the second outer wall 33D of the first inertial mass 33 and, in the rest condition of the first inertial mass 33, are arranged at a same first stop distance $d_s'$ from the second outer wall 33D of the first inertial mass 33.

The MEMS accelerometer 30 further comprises a third stop element 42, arranged at a respective second stop distance $d_s''$ from the second inertial mass 34 when the latter is in the rest condition (FIG. 2). In particular, the second stop distance $d_s''$ is greater than the first stop distance $d_s'$ and preferably greater than the maximum translation movement of the second inertial mass 34 during the statistically expected operation of the MEMS accelerometer 30, as clarified hereinafter.

In use, the first inertial mass 33 and the electrodes 43, 45 are biased at respective biasing voltages, which result, for example, in an effective voltage of approximately 1 V between the first inertial mass 33 and the electrodes 43, 45. As a result of the biasing, the first inertial mass 33 is subjected to a total electrostatic force $F_{el}'$, given by the sum of a first and of a second electrostatic force $F_{el1}'$, $F_{el2}'$. In detail, the first electrostatic force $F_{el2}'$ acts between the first electrode 43 and the first surface 33A, and the second electrostatic force $F_{el2}'$ acts between the second electrode 45 and the second surface 33B.

The MEMS accelerometer 30 is designed so that, in the rest condition (FIG. 2), the first and second distances $d_1'$, $d_2'$, as well as the first and second capacitances $C_1'$, $C_2'$, are equal to each other. Consequently, the first and second electrostatic forces $F_{el1}'$, $F_{el2}'$ are equal to each other and the total electrostatic force $F_{el}'$ is zero.

When the fixed structure 41 of the MEMS accelerometer 30 is subject to an external acceleration $a_{ext}$ directed along the sensing axis S (for example, downwards in the drawing plane), the first and second inertial masses 33, 34 displace in the opposite direction (for example, upwards in the drawing plane), causing the extension of the first spring element 37.

In this step, the second inertial mass 34 and the second spring element 38 rigidly translate with the first inertial mass 33; in fact, due to the greater stiffness of the second spring element 38 as compared to the first spring element 37, the second spring element 38 remains substantially undeformed in the first part of the movement of the MEMS accelerometer 30.

Figure 1B:
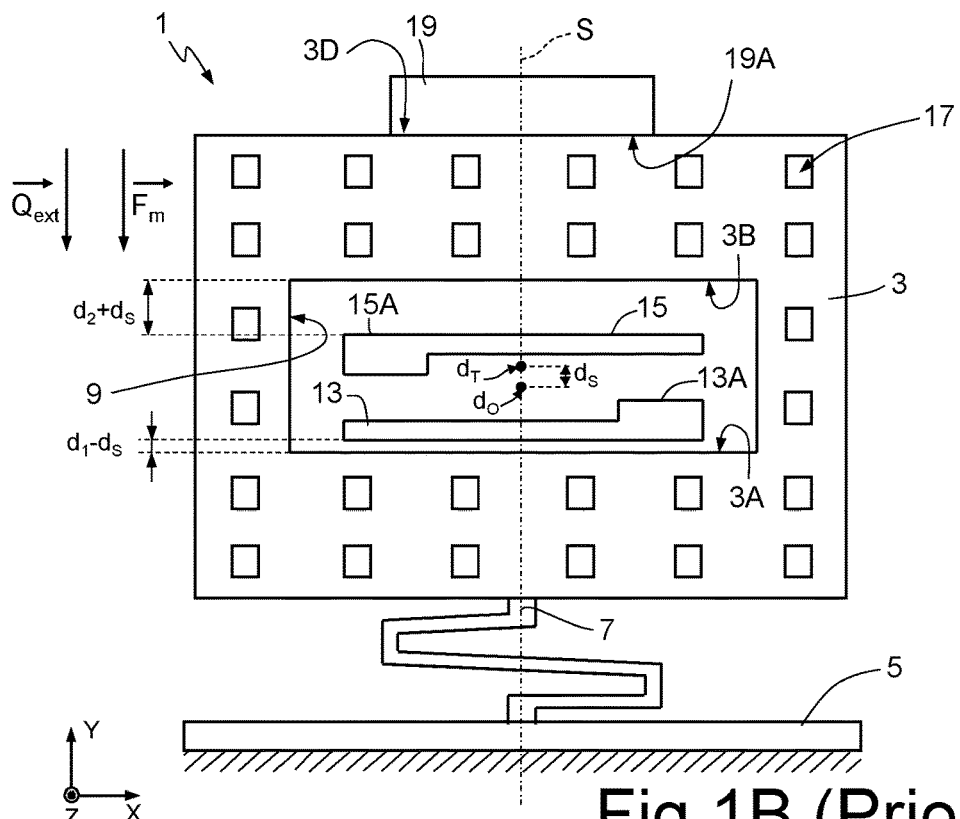

Consequently, and analogously to what described with reference to FIG. 1B, the distances $d_1'$, $d_2'$ between the first inertial mass 33 and the electrodes 43, 45 (and therefore the capacitances $C_1'$, $C_2'$) vary. In the considered example, the first distance $d_1'$ decreases, and the second distance $d_2'$ increases; therefore, in this step, the first capacitance $C_1'$ increases, and the second capacitance $C_2'$ decreases.

Figure 3:
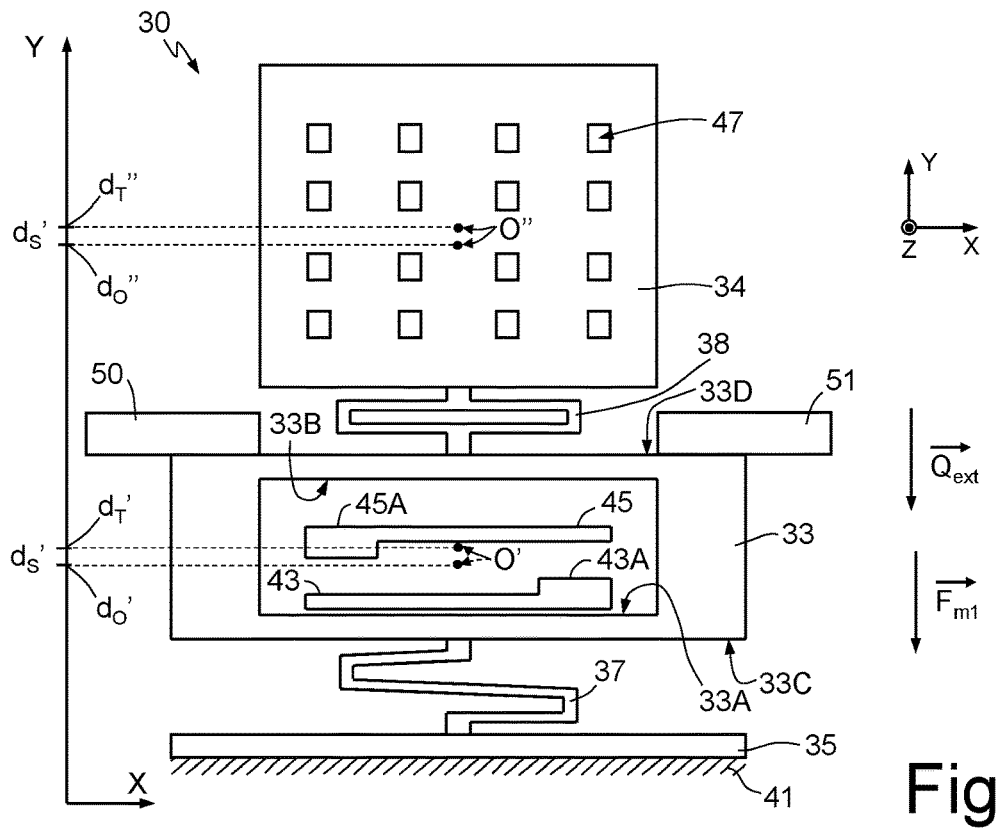

The extension of the spring element 37 and the translation of the first inertial mass 33 are interrupted when the first inertial mass 33 abuts against the stop elements 50, 51, i.e., when the first inertial mass 33 has covered a distance equal to the first stop distance $d_s'$. This condition is represented in FIG. 3, which shows, along the first Cartesian axis Y, both the rest positions $d_0'$, $d_0''$ of the centroids O' and O'' of the first and second inertial masses 33, 34 and the positions $d_T'$ and $d_T''$ of the same centroids O' and O'' when the first inertial mass 33 stops against the stop elements 50, 51.

In particular, in this condition, $d_T'$ constitutes a first translated position of the first inertial mass 33, with $d_T'=d_0'+d_s'$. Consequently, the distance between the first electrode 43 and the first inner surface 33A is equal to $d_1'-d_s'$, and the distance between the second electrode 45 and the second inner surface 33B is equal to $d_2'+d_s'$; therefore, the first and second capacitances $C_1'$, $C_2'$, as well as the respective first and second electrostatic forces $F_{el1}'$, $F_{el2}'$, are no longer equal to each other.

Consequently, the first inertial mass 33 is subject to a total electrostatic force $F_{el}'$ defined according to Eq. (1) analogously to the total electrostatic force $F_{el}$ of the MEMS accelerometer 1 of FIGS. 1A-1B.

Figure 4:
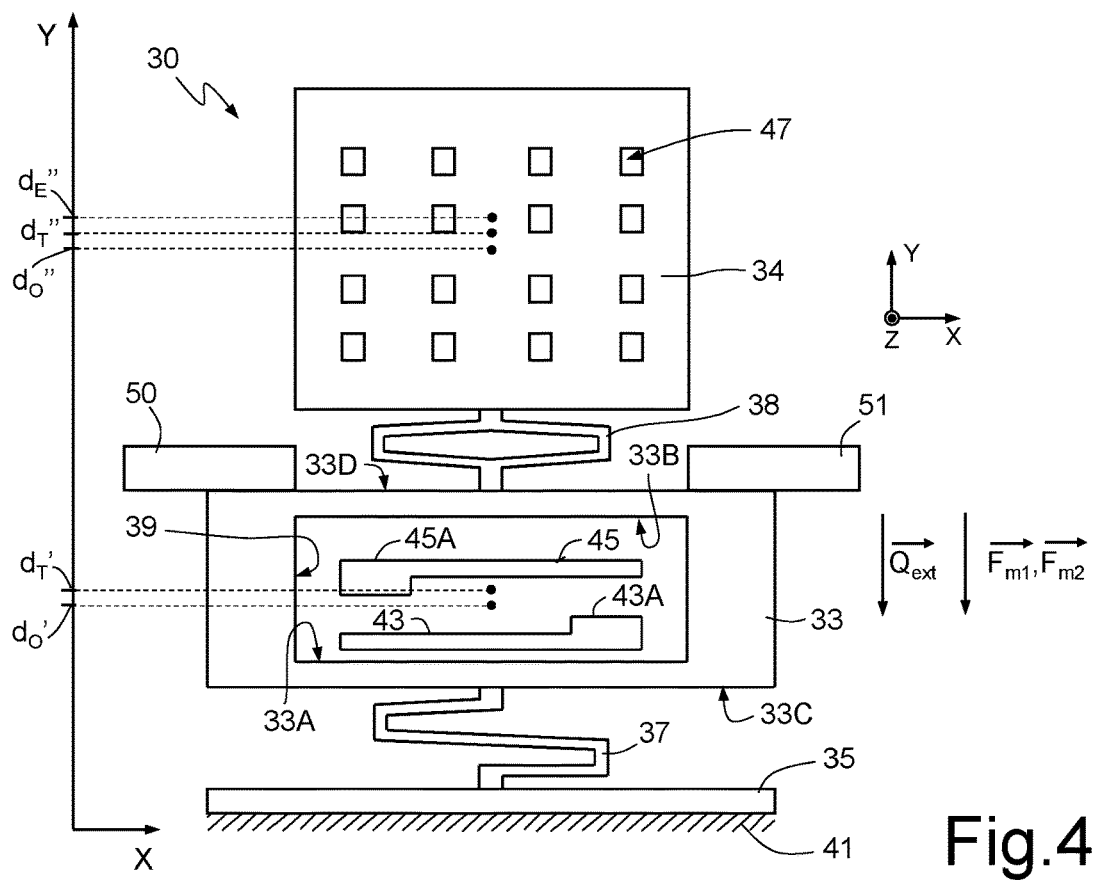

Next, FIG. 4, since the external acceleration $a_{ext}$ still acts on the MEMS accelerometer 30, the first inertial mass 33 abuts against the stop elements 50, 51 and the second inertial mass 34 is free to move. The latter proceeds with its movement, and the second spring element 38 extends until the structure formed by the first and second inertial masses 33, 34 reaches an equilibrium, depending upon the geometrical parameters (position of the third stop element 42, stiffness of the second spring element 38) and upon the amplitude of the external acceleration $a_{ext}$, generally coming to a stop before the third stop element 42. At equilibrium, the centroid O" of the second inertial mass 34 moves into a final translated position at a distance $d_E"=d_T"+d_x"$ from the center of the Cartesian system XYZ, where $d_x"$ is the distance covered by the second inertial mass 34 after the first inertial mass 33 has come into abutment against the stop elements 50, 51.

When the external acceleration $a_{ext}$ terminates (i.e., $a_{ext}=0$), the return forces of the first and second spring elements 37, 38 act to bring the first and second inertial masses 33, 34 back into the respective rest positions $d_0'$, $d_0"$ of FIG. 2. In particular, the spring elements 37, 38 are subject to respective elastic return forces $F_{m1}$, $F_{m2}$ acting along the sensing axis S, opposite to the previous extension direction (for example, downwards in the drawing plane).

Figure 5:
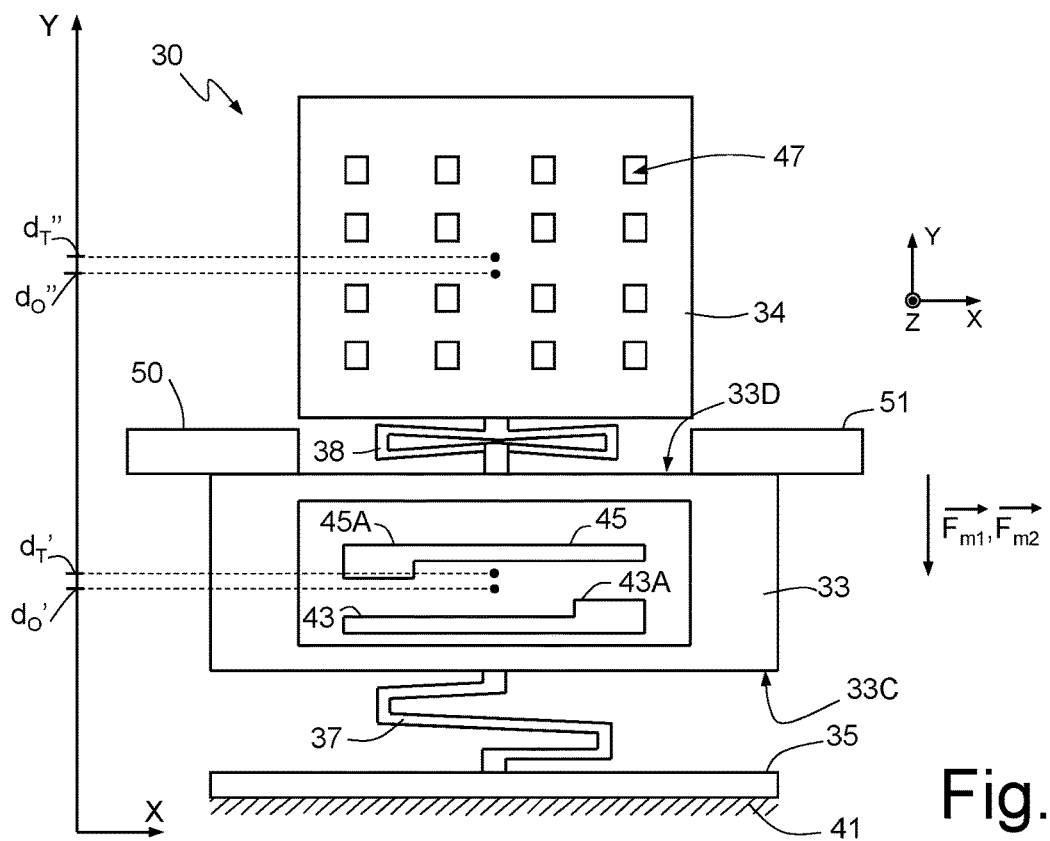

With the MEMS accelerometer 30 of FIGS. 2-4, if the first inertial mass 33 is subject to a stiction force $F_a'$ such as to keep it in contact with the respective stop elements 50, 51, the second mass 34 (which is not into abutment against the third stop element 42) acts so as to detach it from the stop elements 50, 51. In fact, the second inertial mass 34 and the second spring element 38 form a dynamic system with one degree of freedom subject to an acceleration step and, when the external acceleration $a_{ext}$ becomes zero, the second inertial mass 34 is recalled towards its initial equilibrium position, as a result of the elastic potential energy stored in the second spring element 38 (FIG. 5).

The return movement of the second spring element 38 and therefore of the second inertial mass 34 exerts a thrust "backwards" (downwards in the drawing plane) upon the first inertial mass 33, which adds to the elastic return force $F_{m1}$ of the first spring element 37 so as to overcome the total electrostatic force $F_{el}'$ and possible stiction forces $F_a'$ acting on the first inertial mass 33, detaching it from the stop elements 50, 51. The MEMS accelerometer 30 can thus return into the initial rest position of FIG. 2.

A processing system (not illustrated), coupled to the electrodes 43, 45 and to the first inertial mass 33 is thus able to detect the variations of the capacitances $C_1'$, $C_2'$ and calculate the value of the external acceleration $a_{ext}$ therefrom (in the limits of the full-scale value of the MEMS accelerometer 30), analogously to known MEMS accelerometers.

Figure 6:
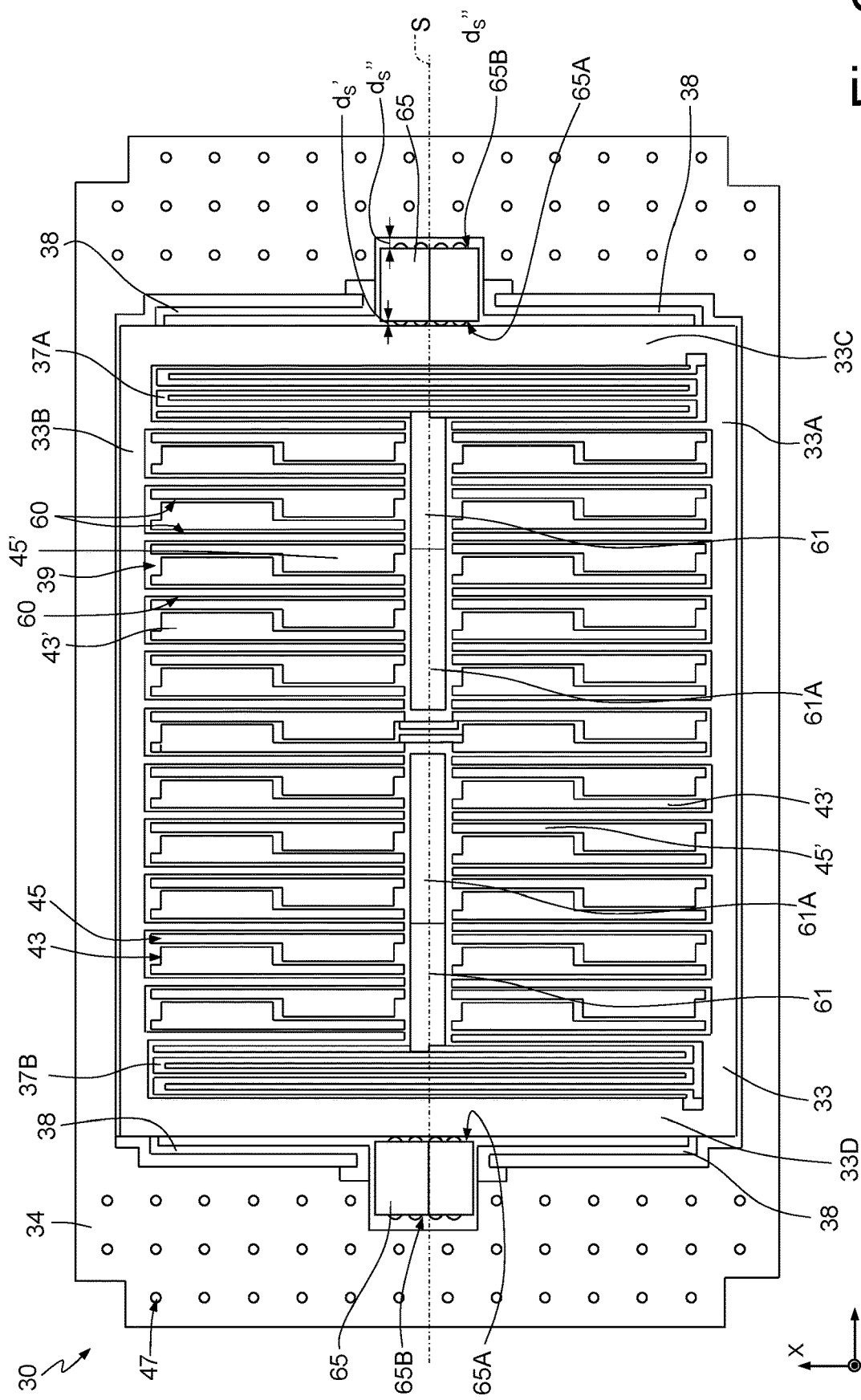
FIG. 6 shows a possible implementation of the present MEMS inertial sensor.

FIG. 6 shows an implementation of the present MEMS accelerometer. In detail, parts similar to the ones illustrated and described with reference to FIGS. 2-5 are designated in FIG. 6 by the same reference numbers.

In particular, the first inertial mass 33 still has the shape of a rectangular frame, with two major sides 33A, 33B and two minor sides 33C and 33D. Intermediate arms 60 extend from the two major sides 33A, 33B towards the center of the opening 39 and are arranged perpendicular to the sensing axis S (therefore, parallel to the second Cartesian axis X).

The electrodes 43, 45 of FIG. 2 are here formed by a plurality of regions (hereinafter referred to as first electrode regions 43' and second electrode regions 45') arranged parallel to each other, in pairs. In particular, each pair of regions, formed by a first electrode region 43' and a second electrode region 45', is arranged between two adjacent intermediate arms 60.

In the illustrated embodiment, the intermediate arms 60 have a length that is slightly shorter than one half of the width (in a direction parallel to the second Cartesian axis X) of the opening 39. A pair of first springs 37A, 37B forms the first spring element 37 of FIG. 2; the first springs 37A, 37B extend from respective minor sides 33C, 33D of the first inertial mass 33 towards the inside of the opening 39 and are connected to transverse arms 61, also extending inside the opening 39 in a central position and in a direction parallel to displacement direction S (thus parallel to the first Cartesian axis Y). The transverse arms 61 are provided with respective anchoring portions 61A, rigid with the fixed structure (not illustrated).

Moreover, in the MEMS accelerometer 30 of FIG. 6, the second inertial mass 34 also has the shape of a frame and surrounds the first inertial mass 33. Here, the second spring element 38 of FIG. 2 is formed by four second springs, designated once again by 38, with linear shape, extending from the corners of the frame shape of the first inertial mass 33.

A pair of stop elements 65 extends between the first and second inertial masses 33, 34. In particular, each stop element 65 has a first face 65A facing the first inertial mass 33 and arranged (in the rest condition of the MEMS accelerometer 30) at the first stop distance $d_s'$ from the latter, and a second face 65B facing the second inertial mass 34 and arranged (in the rest condition of the MEMS accelerometer 30) at the second stop distance $d_s"$ therefrom. As may be noted, the first stop distance $d_s'$ between the first inertial mass 33 and the first face 65A is smaller than the second stop distance $d_s"$ between the second inertial mass 34 and the second face 65B so that, irrespective of the displacement direction S (to the right or to the left in the drawing of FIG. 6), first the first inertial mass 33 abuts against the first face 65A of one of the two stop elements 65 and only later the second inertial mass 34 abuts against the second face 65B of the other stop element 65.

Figure 7:
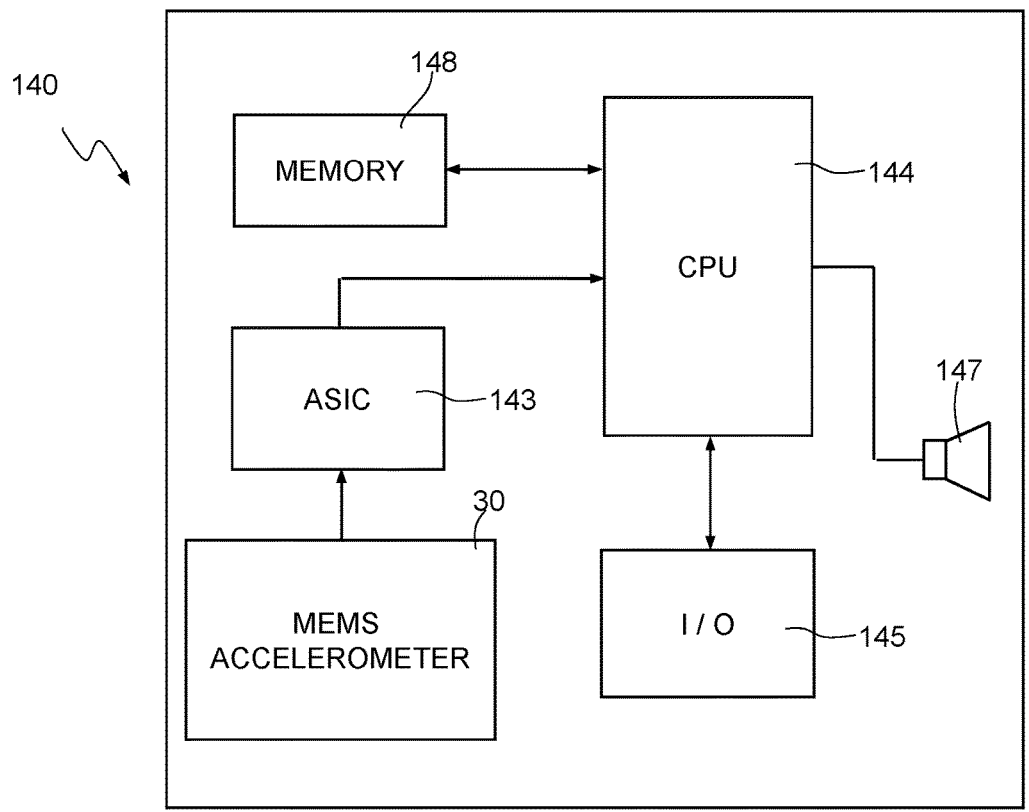
FIG. 7 shows a general block diagram of an electronic apparatus incorporating a MEMS inertial sensor.

FIG. 7 shows an electronic apparatus 140 comprising the MEMS accelerometer 30 of FIGS. 2-6.

The MEMS accelerometer 30 is connected to an ASIC 143 which provides the corresponding read interface. The ASIC 143 can be formed in the same die as the MEMS accelerometer 30. In further embodiments, the ASIC 143 is formed in a separate die and accommodated in the same package as the MEMS accelerometer 30.

The electronic apparatus 140 is, for example, a portable mobile-communication apparatus, such as a mobile phone, a PDA (Personal Digital Assistant), a portable computer, a digital audio player with voice-recording capacity, a photographic video camera, or a controller for videogames; in detail, the electronic apparatus 140 is generally able to process, store, and/or transmit and receive signals and information.

The electronic apparatus 140 further comprises a microprocessor 144, receiving the acceleration signals detected by the MEMS accelerometer 30, and an input/output interface 145, for example provided with a keypad and a display, connected to the microprocessor 144. Moreover, the electronic apparatus 140 here comprises a speaker 147, for generating sounds on an audio output (not illustrated), and an internal memory 148.

The present MEMS inertial sensor has various advantages.

In particular, any possible stiction of the first inertial mass 33 is overcome by virtue of the elastic thrust action exerted by the second inertial mass 34 during the return motion of the latter into the rest position, without substantially having to modify the main constructional and electromechanical parameters of the MEMS accelerometer 30 that determine the performance thereof. In this way, the accelerometer 30 has a sensitivity, resonance frequency, linearity, and accuracy similar to those obtainable by a similar known accelerometer with the same weight, preventing failure due to the stiction of the first inertial mass 33 to the stop elements 50, 51.

In addition, the full scale of the second inertial mass 34 can be defined independently from the full scale of the first inertial mass 33; consequently, it is possible to set the full scale of the second inertial mass 34 so that it is sufficiently large to prevent contact of the second inertial mass 34 with the third stop element 42 for the majority of shock profiles to which the second inertial mass 34 may statistically be subjected in the service life of the MEMS accelerometer 30.

Finally, it is clear that modifications and variations may be made to the MEMS inertial sensor described and illustrated herein, without thereby departing from the scope of the present disclosure.

For instance, the present inertial sensor may be of a different type, such as a gyroscope, an inclinometer, or a vibrometer.

Furthermore, the second inertial mass 34 can have a mass $m_2$ smaller than the mass $m_1$ of the first inertial mass 33.

Figure 8:
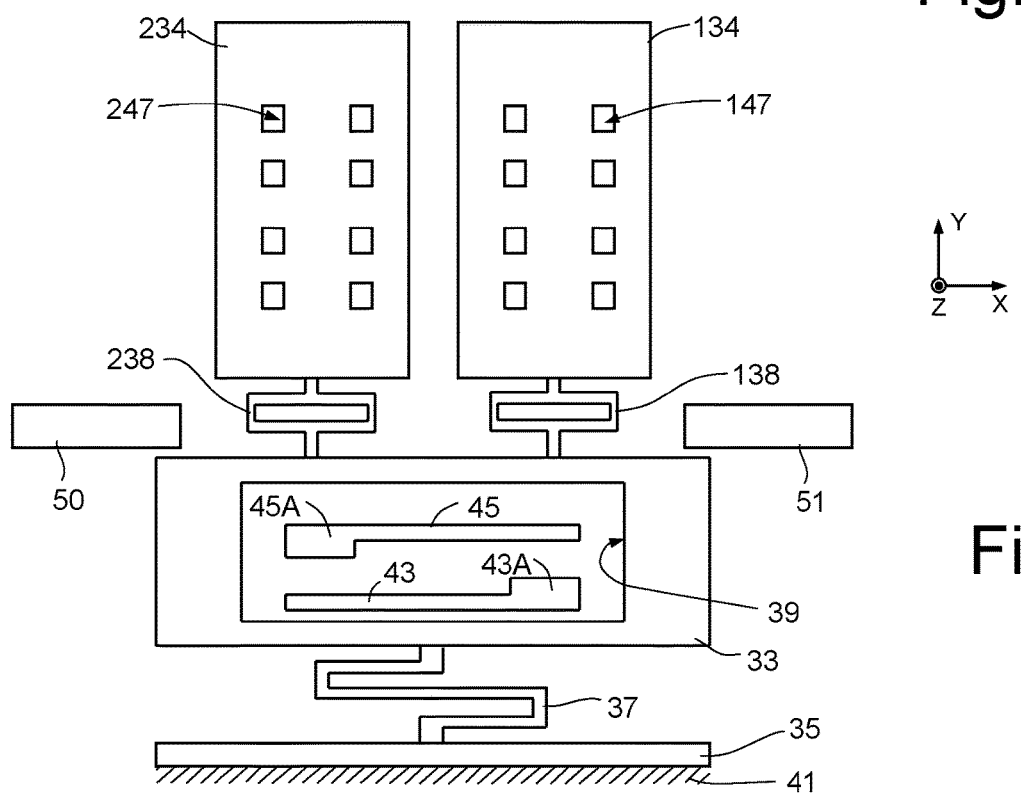
FIG. 8 is a schematic illustration of the present MEMS inertial sensor in top view according to another embodiment.
Figure 9:
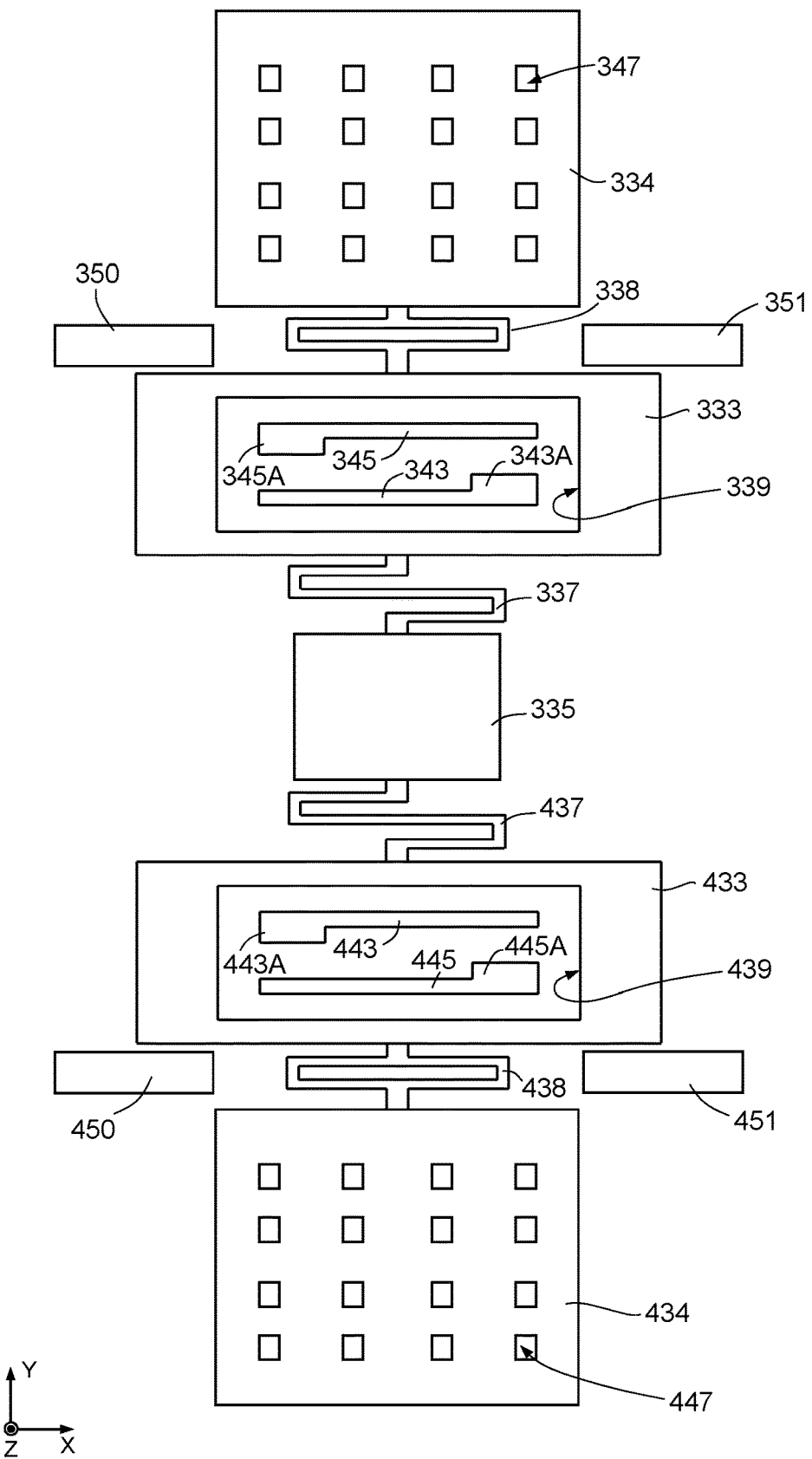
FIG. 9 is a schematic illustration of the present MEMS inertial sensor in top view according to a further embodiment.

In addition, as shown in FIGS. 8 and 9, the first and second inertial masses 33, 34 can be divided into a respective plurality of submasses connected via a respective plurality of elastic elements.

In further detail, FIG. 8 shows a MEMS accelerometer 130 having a general structure similar to that of the MEMS accelerometer 30 illustrated in FIGS. 2-5, so that parts similar to the ones illustrated and described with reference to FIGS. 2-5 are designated in FIG. 8 by the same reference numbers and will not be described any further.

In particular, the MEMS accelerometer 130 comprises a first and a second submass 134, 234, having a general structure similar to the second inertial mass 34 of FIGS. 2-5 and masses, the sum of which is equal to the second mass $m_2$ of the second inertial mass 34 of FIGS. 2-5.

Moreover, the MEMS accelerometer 130 comprises a third and a fourth elastic element 138, 238 that elastically couple the first and, respectively, the second submass 134, 234 to the first inertial mass 33. The third and fourth elastic elements 138, 238 have a structure similar to the second elastic element 38 of FIGS. 2-5 and elastic constants the sum of which is equal to the second elastic constant $k_2$ of the second elastic element 38.

In use, the MEMS accelerometer 130 operates similarly to the MEMS accelerometer 30 of FIGS. 2-5.

FIG. 9 shows a MEMS accelerometer 330 having a general structure similar to the MEMS accelerometer 30 of FIGS. 2-5, where the first and second inertial masses 33, 34 are divided into respective first and second submasses 333, 433, 334, 434, which have a general structure similar to the first and, respectively, the second inertial mass 34 of FIGS. 2-5. The MEMS accelerometer 330 further comprises first and second further stop elements 350, 351, 450, 451, having a general structure similar to the first and second stop elements 50, 51 of FIGS. 2-5 and interposed between the first submasses 333, 334 of the first and second inertial masses 33, 34 and, respectively, the second submasses 433, 434 of the first and second inertial masses 33, 34.

The first and second submasses 333, 433 of the first inertial mass 33 have masses the sum whereof is equal to the first mass $m_1$ of the first inertial mass 33 of FIGS. 2-5 and that are constrained to the constraint element 335 by elastic elements 337, 437, having elastic constants the sum of which is equal to the first elastic constant $k_1$ of the first elastic element 37 of FIGS. 2-5.

The first and second submasses 334, 434 of the second inertial mass 34 have a general structure similar to the first and, respectively, second submasses 134, 234 of the second inertial mass 34 of FIG. 8 and are connected to the first submass 333 and, respectively, to the second submass 433 of the first inertial mass 33 by respective elastic elements 338, 438, having a general structure similar to the third and fourth elastic elements 138, 238 of FIG. 8.

In use, the MEMS accelerometer 330 operates similarly to the MEMS accelerometer 30 of FIGS. 2-5.

In addition, the number of submasses into which the first and second inertial masses 33, 34 can be divided may be greater than two.

Moreover, the various embodiments described may be combined so as to provide further solutions.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a substrate;
a first mass suspended over the substrate, the first mass having a first side opposite a second side, the first mass having an opening;
a second mass suspended over the substrate, the second mass extending from the first side of the first mass;
a third mass suspended over the substrate, the third mass extending from the first side of the first mass and parallel to the second mass;
a first spring coupled between the first side of the first mass and the second mass;
a second spring coupled between the first side of the first mass and the third mass;
a stopper structure between the first side of the first mass and the second mass; and
a first electrode and a second electrode coupled to the substrate, the first and second electrodes being in the opening of the first mass, the first and second electrodes being between the first and second sides of the first mass.

2. The device of claim 1 wherein the stopper structure includes a first anchor coupled to the substrate and a second anchor coupled to the substrate, the first mass including a first corner of the first side and a second corner of the first side.

3. The device of claim 2 wherein the first anchor overlaps the first corner of the first side of the first mass and the second anchor overlaps the second corner of the first side of the first mass.

4. The device of claim 1, further comprising a fixed constraint element, a third spring coupled between the fixed constraint element and the second side of the first mass.

5. The device of claim 4 wherein the first mass is between the fixed constraint element and the stopper structure.

6. The device of claim 5 wherein the stopper structure is between the third mass and the first side of the first mass.

7. A device, comprising:
a substrate;
a fixed constraint coupled to the substrate;
a first mass over the substrate, the first mass having a first outer wall and a first opening;
a first spring coupled between the fixed constraint and the first mass, the fixed constraint arranged outside the first mass and coupled to the first outer wall of the first mass by the first spring;
a second mass over the substrate, the first mass being between the second mass and the fixed constraint;
a second spring coupled between the first mass and the second mass;
a third mass and a fourth mass suspended over the substrate, the fourth mass having a second outer wall and a second opening, the fixed constraint arranged outside the fourth mass and coupled to the second outer wall;
a first stopper structure coupled between the first mass and the second mass;
a second stopper structure coupled between the third mass and the fourth mass;
a first electrode fixed to the substrate, the first electrode being in the first opening; and
a second electrode fixed to the substrate, the second electrode being in the first opening.

8. The device of claim 7, comprising a third spring that is coupled between the fixed constraint and the fourth mass.

9. The device of claim 8, comprising a fourth spring that is positioned over the substrate and coupled between the third mass and the fourth mass.

10. The device of claim 9, wherein the third mass is coupled to the fourth mass, the fourth mass being between the third mass and the fixed constraint.

11. The device of claim 10 wherein the fourth mass has a third electrode and a fourth electrode coupled to the substrate, the third and fourth electrodes being in the second opening.

12. A device, comprising:
a substrate;
a rigid constraint coupled to the substrate;
a first spring;
a first mass having a first opening, the first spring coupled between the rigid constraint and a first side of the first mass, the first mass having a second side opposite to the first side;
a second mass extending from the second side of the first mass;
a second spring coupled between the second side of the first mass and the second mass;
a third mass extending from the second side of the first mass, the third mass being substantially parallel to the second mass;
a third spring coupled between the second side of the first mass and the third mass, the second and third springs being spaced from the first spring by the first mass;
a first stopper fixed to the substrate, the first stopper overlapping a first corner of the second side of the first mass;
a second stopper fixed to the substrate, the first and second stoppers are physically separate from the first mass, the second mass, and the third mass, the second stopper overlapping a second corner of the second side of the first mass, the first stopper is spaced from the second stopper by a first dimension in a first direction, an outer edge of the second mass is spaced from an outer edge of the third mass by a second dimension in the first direction in a resting state, the second dimension being less than the first dimension.

13. The device of claim 12, comprising a first electrode fixed to the substrate and a second electrode fixed to the substrate, the first and second electrodes being in the first opening.

14. The device of claim 13 wherein a first outer side of the first mass is spaced from a second outer side of the first mass by a third dimension in the first direction, the third dimension being greater than the first dimension.

15. The device of claim 14 wherein the first electrode includes a first extension and a first indentation, the second electrode includes a second extension and a second indentation, the first indentation faces the second indentation.

16. The device of claim 14 wherein a first stopper structure includes a fourth dimension in the first direction that is less than the second dimension.

17. The device of claim 12 wherein the second mass includes a longest dimension in a second direction that is transverse to the first direction and the third mass includes a longest dimension in the second direction, the second mass and the third mass being substantially parallel in the resting state.

* * * * *